(12) United States Patent
Schug

(10) Patent No.: US 10,347,801 B2
(45) Date of Patent: Jul. 9, 2019

(54) LIGHT EMITTING DEVICE

(71) Applicant: KONINKLIJKE PHILIPS N.V., Eindhoven (NL)

(72) Inventor: Josef Andreas Schug, Wuerselen (DE)

(73) Assignee: Koninklijke Philips N.V., Eindhoven (NL)

( * ) Notice: Subject to any disclaimer, the term of this patent is extended or adjusted under 35 U.S.C. 154(b) by 140 days.

(21) Appl. No.: 15/506,684

(22) PCT Filed: Aug. 27, 2015

(86) PCT No.: PCT/EP2015/069620
§ 371 (c)(1),
(2) Date: Feb. 24, 2017

(87) PCT Pub. No.: WO2016/034482
PCT Pub. Date: Mar. 10, 2016

(65) Prior Publication Data
US 2017/0256685 A1    Sep. 7, 2017

(30) Foreign Application Priority Data

Sep. 2, 2014 (EP) ..................................... 14183236

(51) Int. Cl.
*H01S 5/00* (2006.01)
*H01L 33/50* (2010.01)
(Continued)

(52) U.S. Cl.
CPC .............. *H01L 33/504* (2013.01); *F21K 9/64* (2016.08); *F21V 9/30* (2018.02); *F21V 9/40* (2018.02);
(Continued)

(58) Field of Classification Search
None
See application file for complete search history.

(56) References Cited

U.S. PATENT DOCUMENTS

| 7,492,507 B1 | 2/2009 | Gollier |
| 7,693,194 B2 | 4/2010 | Sakai et al. |

(Continued)

FOREIGN PATENT DOCUMENTS

| CN | 1977430 A | 6/2007 |
| CN | 101847821 A | 9/2010 |

(Continued)

OTHER PUBLICATIONS

Extended European Search Report dated Feb. 24, 2015, European Patent Application No. 14183236.0, 8 pages.

(Continued)

*Primary Examiner* — Joseph L Williams
*Assistant Examiner* — Jacob R Stern

(57) ABSTRACT

The present invention relates to a light emitting device comprising: a substrate; a translucent light mixing element arranged on the substrate; a color converting element arranged on top of the translucent light mixing element and arranged such that light from the translucent light mixing element is coupled into the color converting element; and a laser diode configured to emit light of a first color into the translucent light mixing element; wherein the color converting element is configured to convert a part of the light of the first color to a second color, to mix light of the first color with light of the second color to generate light of a third color, and to emit light of the third color; and wherein the translucent light mixing element has a thermal conductivity exceeding 10 W/mK.

20 Claims, 4 Drawing Sheets

(51) Int. Cl.
  *F21V 9/40* (2018.01)
  *F21V 9/30* (2018.01)
  *H01S 5/022* (2006.01)
  *F21K 9/64* (2016.01)
(52) U.S. Cl.
  CPC .......... *H01L 33/507* (2013.01); *H01S 5/0092* (2013.01); *H01S 5/022* (2013.01)

(56) References Cited

U.S. PATENT DOCUMENTS

| | | |
|---|---|---|
| 2004/0145308 A1 | 7/2004 | Rossner et al. |
| 2010/0246159 A1 | 9/2010 | Wada |
| 2011/0123184 A1 | 5/2011 | Mather et al. |
| 2011/0210658 A1 | 9/2011 | Pan et al. |
| 2012/0224384 A1* | 9/2012 | Takahira .................. F21K 9/56 362/509 |
| 2013/0099264 A1 | 4/2013 | Zimmerman et al. |

FOREIGN PATENT DOCUMENTS

| | | |
|---|---|---|
| CN | 102159756 A | 8/2011 |
| DE | 102012206970 A1 | 10/2013 |
| JP | 2009087570 A | 4/2009 |
| WO | 2010067291 A1 | 6/2010 |
| WO | 2013056009 A1 | 4/2013 |
| WO | 2014030089 A1 | 2/2014 |

OTHER PUBLICATIONS

EPO as ISA, "International Search Report and Written Opinion" dated Feb. 16, 2016 from International Application No. PCT/EP2015/069620, filed Aug. 27, 2015, 13 pages.

First Office Action dated Aug. 2, 2018, China Patent Application No. 201580047190.5, 13 pages.

* cited by examiner

US 10,347,801 B2

LIGHT EMITTING DEVICE

CROSS-REFERENCE TO RELATED APPLICATIONS

The present application is a § 371 application of International Application No. PCT/EP2015/069620 filed on Aug. 27, 2015 and entitled "A LIGHT EMITTING DEVICE," which claims the benefit of European Patent Application No. 14183236.0 filed on Sep. 2, 2014. International Application No. PCT/EP2015/069620 and European Patent Application No. 14183236.0 are incorporated herein.

FIELD OF THE INVENTION

The present invention relates to a light emitting device utilizing color conversion.

BACKGROUND OF THE INVENTION

In order to obtain e.g. white light, light emitted from a LED or a laser diode can be mixed with wavelength converted light emitted from phosphor particles in a phosphor layer having absorbed the emitted light from the LED or laser diode. When light emitted from the LED or laser diode is wavelength converted, heat is generated by the phosphor layer due to Stokes shift and light absorption. When the intensity, or flux density, of the originally emitted light increases, e.g. when it is emitted from a laser diode, the heating power of the phosphor layer also increases.

As can be understood from above, the heating power per area unit of the phosphor layer depends on the area of the phosphor layer. This means that when the area of the phosphor layer is large, the generated heat is more easily dissipated through for example the substrate onto which the phosphor is mounted. On the other hand, when the area of the phosphor layer decreases, this means that the heating power per area unit increases. This may cause the phosphor layer to undergo temperature quenching since all the generated heat cannot dissipate. The effect of temperature quenching is that the emission intensity of the phosphor layer dramatically decreases.

In many embodiments, it is advantageous to reduce the area of the phosphor layer, since the available space for a light emitting device comprising the phosphor layer is small. In JP2009087570 (Sharp KK), such a reduced size is allegedly achieved by e.g. reducing the coupling area between the laser beam and a light guide such that the ratio between the coupling area between the laser beam and a light guide, and the coupling area between the light guide and the phosphor layer is increased. However, since the problem of heat dissipation is not addressed, the phosphor layer cannot be too small or the risk of temperature quenching is increased.

Accordingly, there is a need for an improved way of implementing a light emitting device comprising a phosphor layer, wherein the light emitting device is having improved thermal properties.

SUMMARY OF THE INVENTION

It is an object of the present invention to overcome this problem, and to provide a lighting device with improved thermal management.

According to a first aspect of the invention, this and other objects are achieved by a light emitting device comprising: a substrate; a translucent light mixing element arranged on the substrate; a color converting element arranged on top of the translucent light mixing element and arranged such that light from the translucent light mixing element is coupled into the color converting element; and a laser diode configured to emit light of a first color into the translucent light mixing element. The color converting element is being configured to convert a part of the light of the first color to a second color, to mix light of the first color with light of the second color to generate light of a third color, and to emit light of the third color. The translucent light mixing element has a thermal conductivity exceeding 10 W/mK.

Hence, translucent is to be understood as "permitting the passage of light" and a translucent material may either be clear, i.e. transparent, or transmitting and diffusing light so that objects beyond the translucent light mixing element cannot be seen clearly. Transparent is to be understood as "able to be seen through".

The term "configured to convert a part of the light of the first color to a second color" should, in the context of the present specification, be understood in that a limited part of the light of the first color or all or almost all the light of the first color is converted to a second color. As an example, the light of a first color can be blue light which is partly converted to a second color which is yellow. The blue and yellow light can be mixed to a light of a third color, which can be white. In a second example, the blue light can be fully converted to a second color which can be amber light. In the latter case, the second and the third color are the same.

Any power that is generated in the light converting element as heat due to the

Stokes shift or absorption needs to be dissipated to a heat sink. Typically, this heat is transported via the bottom of the substrate to a heat sink to which the light emitting device is attached. Dissipation by heat radiation or convection is in general very low in this type of applications. Thus, the heat needs to pass through the translucent light mixing element. By providing a light emitting device wherein the translucent light mixing element has a specific thermal conductance of at least 10 W/mK, the resulting temperature difference between the heat sink and the color converting element is decreased. An advantage of this is that the power of the laser diode can be increased without risking temperature quenching of the color converting element. Alternatively or additionally, the area of the translucent light mixing element can be decreased since the temperature difference in the color converting element depends on the ratio between the power of the laser diode, the area of the translucent light mixing element and the thermal conductivity of the translucent light mixing element.

According to embodiments of the invention, the translucent light mixing element is made from sapphire, aluminum oxynitride, yttrium oxide, yttrium aluminum garnet or magnesium fluoride. These materials all have a thermal conductivity exceeding 10 W/mK. According to some embodiments, synthetic sapphire is used, which is relatively easy and cheap to manufacture and thus advantageous for cost reasons. Some of these materials also have an improved resistance to scratches compared to common light mixing element materials such as glass.

According to further embodiments of the invention, the power density in the color converting element is 2 $W/mm^2$ or more. This power density is a factor 2-3 higher than the one that can be achieved in currently available high power LEDs. This allows for higher luminance of light emitted by the light emitting device. Since the translucent light mixing element has a thermal conductivity of at least 10 W/mK, the color converting element can manage such high power density without risking temperature quenching. According to further embodiments, the power density in the color converting element is 4 W/mm² or more. According to yet further embodiments, the power density in the color converting element is 10 W/mm² or more.

The term "power density" should, in the context of the present specification, be understood as the ratio between
- the part of the power of the laser beam entering the color converting element and converted to heat due to the Stokes shift or absorption, and
- the area of the color converting element.

This will be further described below.

According to embodiments of the invention, the substrate is a common substrate onto which the laser diode and the color converting element are arranged. This facilitates a smaller light emitting device and an easier manufacturing process.

According to embodiments of the invention, the laser diode is arranged in close proximity to the color converting element. The laser diode, i.e. the exit window of the laser diode for emitting light, may for example be arranged 30-70 μm away from the color converting element. This may decrease the total size of the light emitting device. This also may reduce the need of a lens or other collimating means for focusing the laser beam onto the translucent light mixing element for further guidance into the color converting element. Moreover, by placing the laser diode in close proximity to the color converting element and thus in close proximity to the translucent light mixing element, the area of the translucent light mixing element needed for coupling in the laser beam may be reduced. This may reduce the size of the light emitting device.

According to embodiments of the invention, the color converting element and/or the translucent light mixing element comprise reflective coatings. Consequently, the light emitted by the color converting element may be guided in a certain direction. A further effect may be that the part of light coupled into the color converting element via the translucent light mixing element is increased in case the translucent light mixing element comprises reflective coatings on the areas not used for coupling in light from the laser diode and also not used for coupling out light into the color converting element.

According to embodiments of the invention, the laser diode is configured to emit the light of the first color into a sub portion of a side of the translucent light mixing element, and wherein the translucent light mixing element is provided with reflective coatings on the entire side except for the sub portion. This may increase the effect, i.e. increase the amount of light emitted by the light emitting device, since light leakage from the translucent light mixing element may be reduced.

According to further embodiments of the invention, the laser diode is configured to emit light along a surface of the substrate into the translucent light mixing element, and wherein the color converting element is arranged to emit light in a direction substantially perpendicular to the surface of the substrate. This may reduce the thickness of the light emitting device compared to the case where the laser diode is arranged beneath the translucent light mixing element.

The term "thickness/height of the light emitting device" should, in the context of the present specification, be understood as the distance from the substrate to the top of the color converting element, i.e. the part of the color converting element furthest away from the substrate.

According to embodiments of the invention, the light emitting element further comprises a translucent wave guide element arranged between the laser diode and the translucent light mixing element, wherein the laser diode is configured to emit the light of the first color into the translucent light mixing element via the wave guide element.

This may reduce the spread of the laser beam before it hits the translucent light mixing element which allows for some distance between the laser diode and the translucent light mixing element. This also creates freedom with respect to the realization of the reflective coating, e.g. a diffuse reflective side coating could be applied to the translucent light mixing element preassembled on the substrate with the light converting element on top and the wave guide element at the side. The surface of the wave guide element could be protected during that process and would be unaffected by the process of applying the side coating. This may further reduce the height and width of the sub portion of the side of the translucent light mixing element into which the light from the laser diode is emitted. This is advantageous since it may reduce light loss through this sub portion after multiple reflections of light in the light mixing element.

The wording "wave guide" should here be understood as a structure arranged to transmit or guide light along its extension. Light may for example be guided inside the wave guide by multiple reflections. The light is preferably transmitted within the wave guide by multiple reflections at the interface of the wave guide and its surrounding environment, i.e. by total internal reflection.

According to further embodiments of the invention, the translucent light mixing element and the translucent wave guide element are integrally formed, i.e. manufactured from a single piece of a continuous material. This may simplify the manufacturing process of the light emitting device.

According to further embodiments of the invention, the light emitting element further comprises a lens arranged between the laser diode and the translucent light mixing element. The distance between the laser diode and the lens and the distance between the lens and the translucent light mixing element may for example be two times the focal length of the lens. This intermediate lens may be used for reducing, in particular, the height of the light emitting device since the area of the translucent light mixing element needed for coupling in the light emitted by the laser diode into the color converting element is reduced. This may further reduce the height and width of the sub portion of the side of the translucent light mixing element into which the light from the laser diode is emitted and which is not covered with a reflective side coating and thus light loss may be reduced according to above. The lens may be a rotationally symmetrical lens or a lens with different strength along a vertical and horizontal direction. In particular, it may be a cylinder lens which focuses the light, e.g. laser beam, only in the vertical direction to reduce the height of the emitted light when coupled into the translucent light mixing element or the wave guide element and allow for a reduced height of the light mixing element or the wave guide.

According to embodiments of the invention, the light emitting element further comprises an additional laser diode configured to emit light of a fourth color into the translucent light mixing element, wherein the color converting element is arranged to mix light of the first, second and fourth colors to generate light of a fifth color, and to emit light of the fifth color. This may provide tuning opportunities of the spectral content of light emitted by the light emitting device.

According to embodiments of the invention, the additional laser diode is configured to emit light of the fourth color into the translucent light mixing element via the translucent wave guide element. The additional laser diode may further be arranged adjacent to the laser diode. This may reduce the size of the light emitting device.

According to embodiments of the invention, the light emitting device further comprises a controller for individually controlling the light emitting power of the laser diode and the additional laser diode for controlling the fifth color emitted from the color converting element. This may further facilitate tuning opportunities of the spectral content of light emitted by the light emitting device.

According to embodiments of the invention, the light emitting device further comprises a collimator or a further lens provided at a light emitting surface of the color converting element. Consequently, the direction of light emitted by the light emitting device may be advantageously controlled.

The above described light emitting element may advantageously be used in a flash module. Such a flash module may advantageously be used by a mobile phone since the small size of the light emitting device may facilitate a reduced thickness of the mobile phone.

The above described light emitting element may advantageously be used in remote lighting applications. According to embodiments of the invention, the light emitting device further comprises optics, e.g. a further lens or a group of further lenses, which focuses the light emitted from the light emitting element into the opening of a further light guiding element, e.g. a fiber.

It is noted that the invention relates to all possible combinations of features recited in the claims.

BRIEF DESCRIPTION OF THE DRAWINGS

The above, as well as additional objects, features and advantages of the present invention, will be better understood through the following illustrative and non-limiting detailed description of embodiments of the present invention, with reference to the appended drawings, where the same reference numerals will be used for similar elements, wherein.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
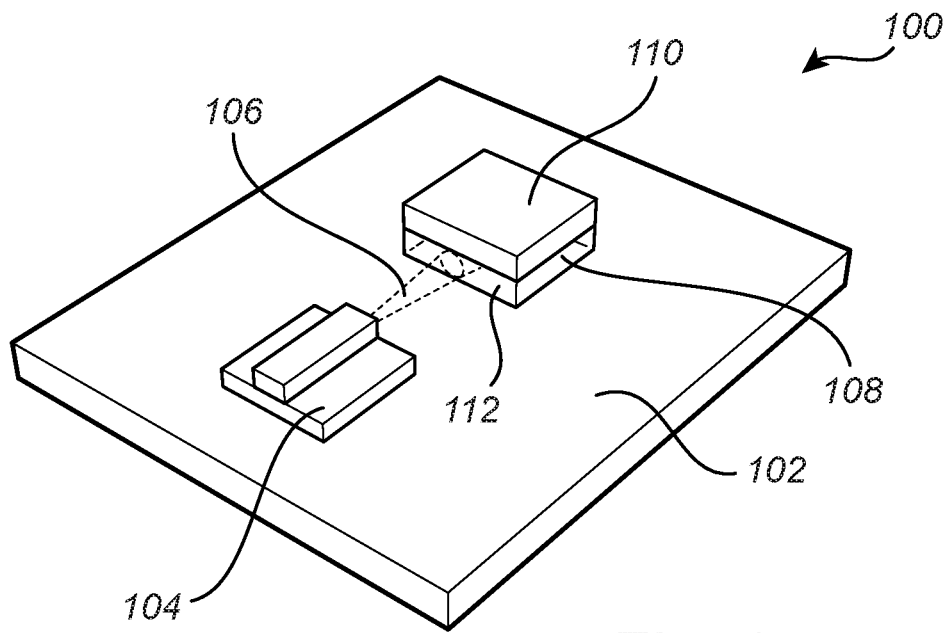
FIG. 1 schematically shows a light emitting device according to a first embodiment of the invention, FIG. 2 schematically shows a light emitting device according to a second embodiment of the invention, FIG. 3 schematically shows a light emitting device according to a third embodiment of the invention, FIG. 4 schematically shows a light emitting device according to a fourth embodiment of the invention, FIG. 5 schematically shows a light emitting device according to a fifth embodiment of the invention.

FIG. 1 shows by way of example a light emitting device 100 according to a first embodiment of the invention. The light emitting device comprises a substrate 102 onto which a translucent light mixing element 108 is arranged. A laser diode 104 is also arranged on the substrate 102 and being configured to emit light 106 of a first color into the translucent light mixing element 108. On top of the translucent light mixing element 108, a color converting element 110 is provided such that light from the translucent light mixing element 108 is coupled into the color converting element 110. The color converting element 110 is configured to convert a part of the light 106 of the first color to a second color, to mix light of the first color with light of the second color to generate light of a third color, and to emit light of the third color. Some of the first and second light may also be emitted. The first color may be a blue color, the second color may then be a yellow color. When these two colors are mixed, light of a white color may be produced and emitted from the color converting element 110.

When light is converted from the first color to the second color in the color converting element, heat is generated in the color converting element due to Stokes shift and light absorption. The amount of generated heat depends on the quantum yield of the element. Normally, a color converting element, such as a phosphor layer, into which blue laser beams are coupled results in 15%-30% heat dissipation. Examples are shown in table 1 below.

TABLE 1 examples of heat dissipation

| Blue input | Absorbed/ converted blue | Quantum yield | Blue out | Yellow out | Heat |
|---|---|---|---|---|---|
| 100% | 75% | 100% | 25% | 58% | 16% |
| 100% | 76% | 95% | 24% | 56% | 20% |

The part of the power of the laser beam entering the color converting element and converted to heat due to the Stokes shift and/or absorption depends on the wavelength of the light of the first color and the type of the color converting element. In the case of converting part of the blue light to yellow light and mixing it to white light, this fraction can typically be in a range between 15% and 25%. In the case of converting blue light fully to amber light, the fraction can be in a range between 25% and 30%. In the case of fully converting blue light to red light, the fraction can be 30% or higher.

Accordingly, a 2 Watt blue laser diode, corresponding to requirements of a camera flash, will result in that approximately 0.4 Watt heat is generated. Such a camera flash which may be used in a mobile phone should be small such as 200 μm×200 μm. 0.4 W/0.04mm$^2$ equals 10 W/mm$^2$ power density of the color converting element 110. In case the laser diode is a high luminance source having a power of 10 W, the resulting power density for such a small color converting element is 50 W/mm$^2$. Such a light emitting element could be used for generating white light with a high luminance and coupling that light efficiently into a narrow fiber, as described above, for remote lighting applications.

As described above, if the temperature increases too much in the color converting element, temperature quenching may occur which dramatically decreases the emission intensity of the color converting element. In order to remove heat from the color converting element, the thermal conductivity of the translucent light mixing element is of vital importance. According to an embodiment of the invention, the translucent light mixing element 108 has a thermal conductivity exceeding 10 W/mK. The translucent light mixing element can for example be made from sapphire (27.21 W/mK), aluminum oxynitride (12.3 W/mK), yttrium oxide (27 W/mK), yttrium aluminum garnet (11-14 W/mK) or magnesium fluoride (21 W/mK). A further possibility is using diamond. This may be compared to conventional materials used for these types of application which are PMMA (~0.2 W/mK), polycarbonate (~0.2 W/mK) or glass, e.g. quartz glass (1.5 W/mK).

A calculation of a resulting temperature difference in the color converting element depending on the thermal resistance for a translucent light mixing element will now be described.

Properties of the translucent light mixing element needed for this calculation are:

thickness (e.g. 100 µm): d[m]
surface area (e.g. 1 mm$^2$): A[m$^2$]
thermal conductivity: λ[W/(mK)]
power: P[W]
power density: p=P/A[W/m$^2$]

The resulting temperature difference $\Delta T[K]=T_{in}-T_{out}$ may thus be calculated as follows:

$$\Delta T=P*d/(A*\lambda)$$

$$\Delta T=P/A*d/\lambda$$

$$\Delta T=p*d/\lambda$$

Some examples of this calculation with different materials of the translucent light mixing element with various thicknesses are shown in table 2 below.

TABLE 2 examples of temperature increase in color converting element.

| Power density [W/mm$^2$] | Material | Thermal conductivity [W/mK] | Thickness [µm] | ΔT [K] |
|---|---|---|---|---|
| 2 | PMMA/polycarbonate | 0.2 | 100 | 1000 |
| 2 | Glass | 1.5 | 50 | 66 |
| 2 | Sapphire | 25 | 25 | 2 |
| 10 | Sapphire | 25 | 25 | 10 |
| 50 | Sapphire | 25 | 25 | 50 |

As can be understood from above, the choice of material of the translucent light mixing element is of vital importance in order to increase the power of the laser diode and/or in order to reduce the size of the color converting element 110. Furthermore, the thickness of the material is relevant and reducing the thickness, as may be achieved by the present invention, is advantageous. According to some embodiments, the thickness of the translucent light mixing element is 100 µm or less, preferably 50 µm or less and more preferably 20 µm or less.

Now turning back to FIG. 1, the color converting element 110 is advantageously designed to completely cover the translucent light mixing element 108 in a vertical direction, which is a direction mainly perpendicular to the substrate surface. This may increase the efficiency of the light emitting device 100.

According to some embodiments, the translucent light mixing element 108 has a thickness of 100 µm or less and an area of 0.1 mm$^2$ or less. The color converting element 110 may have a thickness of 50 µm or less and an area of 0.1 mm$^2$ or less and the power of the laser diode 104 is 2 Watt or more.

According to embodiments, the substrate 102 is a common substrate onto which the laser diode 104 and the color converting element 110 are arranged. These substrates are available with high thermal conductivity which is left to the skilled person to implement. This may further reduce the size of the light emitting element 100. The laser diode 104 can be mounted in an epi-down configuration onto the substrate 102. The substrate 102 may be a flat ceramic submount (e.g. Aluminum Nitride, AlN, or Beryllium oxide, BeO). Alternatively, the laser diode 104 might be mounted directly on highly heat conducting metal e.g. a copper lead frame with an appropriate surface treatment for attaching the laser diode 104.

The laser diode 104 is advantageously configured to emit light 106 along a surface of the substrate 102 into the translucent light mixing element 108. By positioning the laser diode is such a way, the thickness of the light emitting device 100 is reduced compared to the case in which the laser diode is positioned below the translucent light mixing element 108. Moreover, this configuration simplifies the manufacturing process since the laser diode 104 can be mounted onto the substrate 102 at any time in the manufacturing process.

The laser diode 104 is arranged in close proximity to the color converting element 110. Since the opening angle of the emitted light (laser beam) 106 may be as large as 25 degrees, a reduced distance between the light exit window (not shown) of the laser diode 104 and a light in-couple surface 112 of the translucent light mixing 108 facilitates a reduced thickness or height of the translucent light mixing element 108. A 50 µm distance between the light exit window of the laser diode 104 and the light in-couple surface 112 of the translucent light mixing element results in that the thickness of the translucent light mixing element 108 needs to be 50 µm. By placing a lens between the laser diode and the translucent light mixing element, the thickness requirements may be reduced. Alternately, the distance between the light exit window of the laser diode 104 and the light in-couple surface 112 of the translucent light mixing element 108 may be increased. With a short focal length lens in e.g. a 2 f arrangement where the distance between the laser diode 104 and the lens and the distance between the lens and the translucent light mixing element 108 is two times the focal length of the lens, the very small exit window of the laser diode (e.g. ~3 µm×15 µm) can be focused on the in-couple surface 112 of the translucent light mixing element 108 even if the thickness of the translucent light mixing element 108 is reduced below 50 µm.

Figure 4:
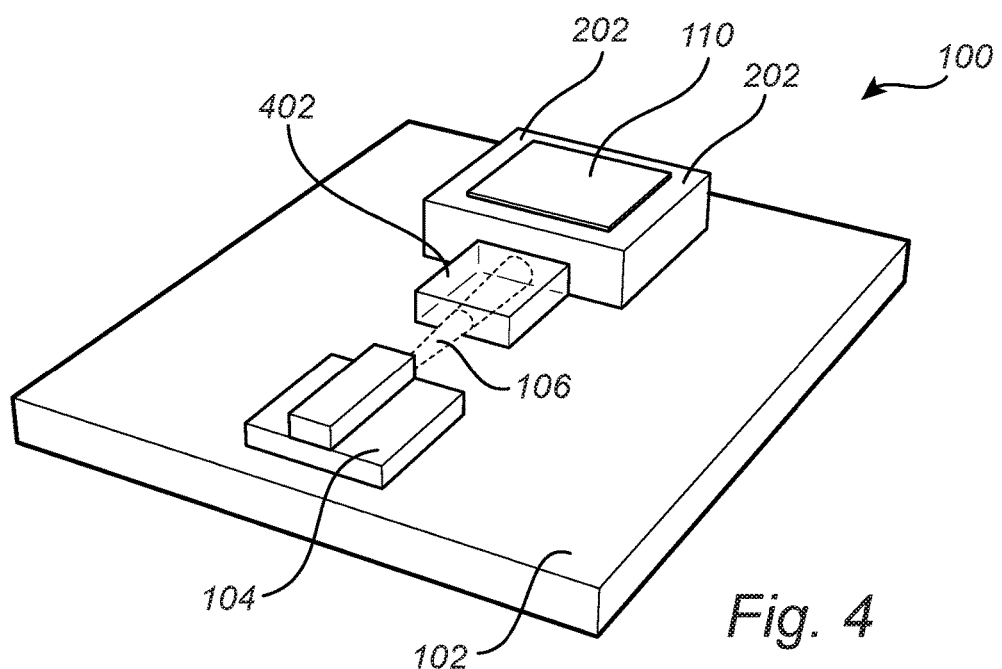

Alternatively or additionally to using a lens as described above, the light emitting element 100 may comprise a translucent wave guide element 402 arranged between the laser diode and the translucent light mixing element. This is shown in FIG. 4. The laser diode 104 is according to this embodiment configured to emit the light 106 of the first color into the translucent light mixing element (not shown) via the wave guide element 402. The translucent light mixing element and the translucent wave guide element 402 are, according to this embodiment, integrally formed. The translucent wave guide element 402 may further reduce the requirements of the thickness of the light mixing element since the vertical spread of the light 106 emitted by the laser diode is stopped when entering the translucent wave guide element 402. As described above, the translucent wave guide element will guide almost all or most of the emitted light 106 into the translucent light mixing element by means of total inner reflection (TIR). According to some embodiments, the material of the translucent wave guide element 402 is the same as the material of the translucent light mixing element. This may simplify the manufacturing process of the light emitting element 100. According to further embodiments, the materials of the translucent wave guide element 402 and of the translucent light mixing element differ. In this case, the material of the translucent wave guide element may be e.g. glass or any other suitable wave guide material.

As visualized in FIGS. 2-5 and 10, the color converting element 110 and the translucent light mixing element 108 may comprise reflective coatings 202. The reflective coatings 202 may also be provided at the bottom of the translucent light mixing element, i.e. between the translucent light mixing element 108 and the substrate 102. Such a coating, which may be a metal mirror, may further facilitate soldering of the translucent light mixing element to the substrate 102. The reflective coatings 202 on the sides of the translucent light mixing element may be a thin film or metal coating. According to embodiments of the invention, the reflective coatings 202, or at least the reflective coating provided at the bottom of the translucent light mixing element 108, is a thin metallic coating with a thermal conductivity exceeding at least 10 W/mK. Such a thin metallic coating enables a good thermal contact between the translucent light mixing element 108 and the substrate 102 e.g. by soldering the metal surface to the substrate. The coating on the side of the translucent light mixing element 108 may be a metallic side coating or a highly reflective diffuse side coating. The thin metallic coating may be composed of silver or aluminum or other highly reflective metals. To protect oxidation, further protective layers and layers enabling a reliable solder interconnect may be added on top of the thin metallic coating.

As also seen in FIG. 4, the laser diode 104 may be configured to emit the light 106 of the first color into a sub portion of a side of the translucent light mixing element, and wherein the translucent light mixing element is provided with reflective coatings 202 on the entire side except for the sub portion. The sub portion is in this case the interface between the translucent light mixing element and the translucent wave guide 402. The feature of providing the translucent light mixing element 108 with reflective coatings 202 on the entire side 112 except for the sub portion 502 is also visualized in FIG. 5. The effect of this may be that the leakage of light out from the translucent light mixing element is reduced. It may be advantageous to reduce the size of the sub portion 502, either by placing the laser diode 104 in very close proximity to the translucent light mixing element, or by means of a lens or a translucent wave guide element 402 as described above.

Figure 5:
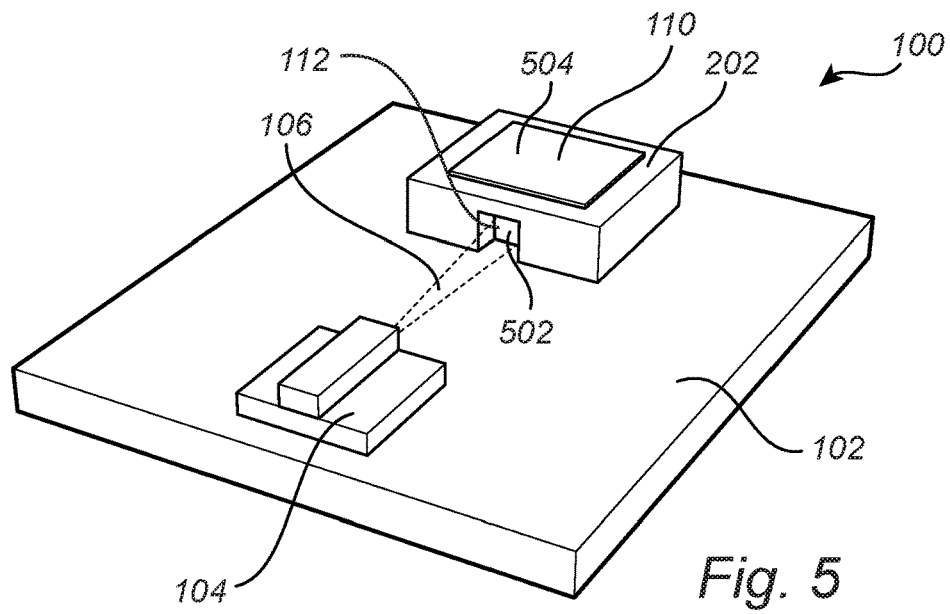
Figure 6:
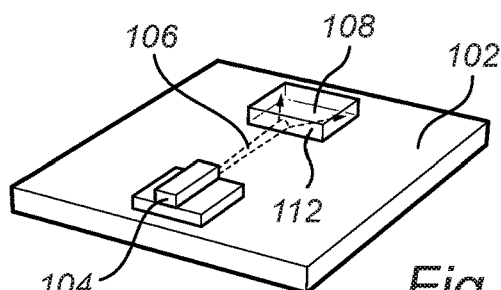
FIGS. 6-8 shows different features and structures of the light emitting device shown in FIG. 5.
Figure 7:
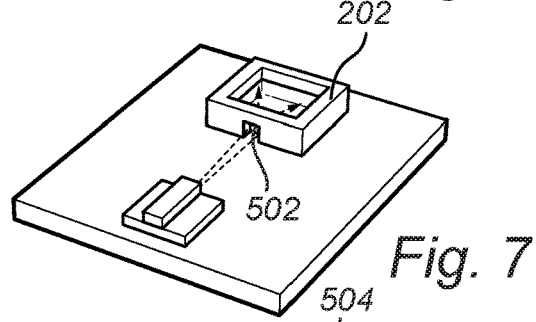
Figure 8:
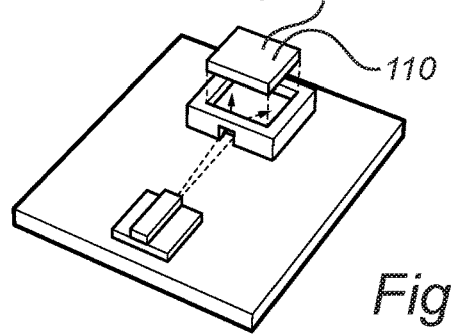

FIGS. 6-8 show by way of example different features and structures of the light emitting device shown in FIG. 5. FIG. 6 schematically describes the light mixing feature of the translucent light mixing element 108. In FIG. 6, the light 106 emitted by the laser diode enters the translucent light mixing element 108 at the light in-couple surface 112 to be mixed within the translucent light mixing element 108. The mixing properties of the translucent light mixing element 108 facilitate a better color homogeneity when the e.g. white light is later emitted by the color converting element 110. FIG. 7 shows the design of one embodiment of the reflective coatings 202. The reflective coatings 202 may decrease light leakage from the translucent light mixing element 108 and the color converting element 110, i.e. facilitate that light is guided towards a emitting surface 504 of the color converting element 110. In FIG. 8 it can be seen that also parts of the color converting element 110 may be provided with the reflective coatings 202.

Figure 2:
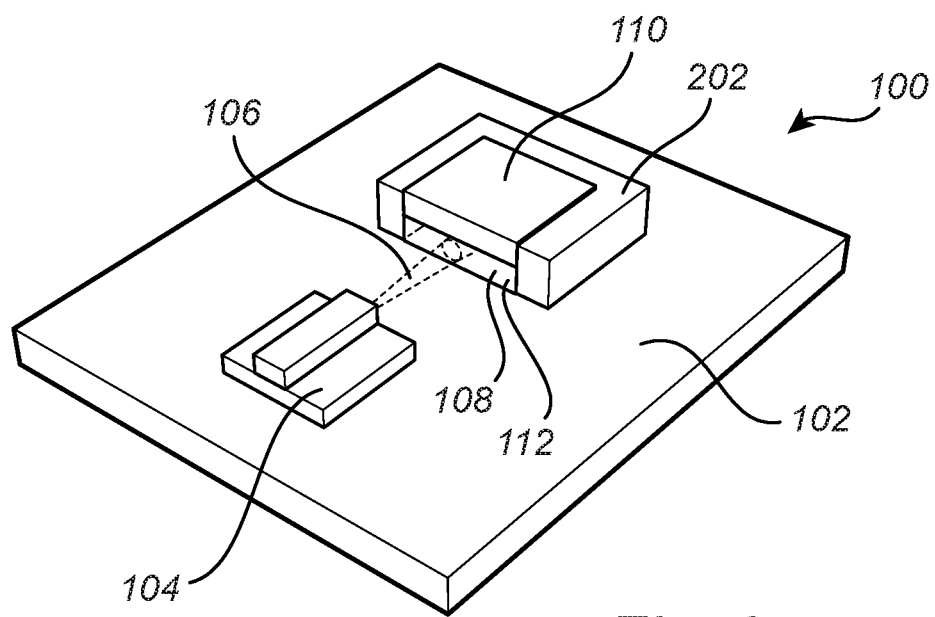

FIG. 2 shows a further embodiment of the light emitting device 100. According to this embodiment, the reflective coatings 202 are not provided at the in-couple surface 112 of the translucent light mixing element 108. This may simplify the manufacturing process of the light emitting element and also provide cost savings since the needed amount of reflective coatings 202 is reduced. As also can be understood from FIG. 2, as well as from the other figures, the color converting element 110 may be arranged to emit light in a direction substantially perpendicular to the surface of the substrate 102. However, this configuration is only shown by way of example. According to other embodiments, the light emitting device 100 may be configured such that the color converting element 110 is arranged to emit light in a direction substantially along the surface of the substrate 102, for example by providing the reflective coatings 202 in a different way.

Figure 3:
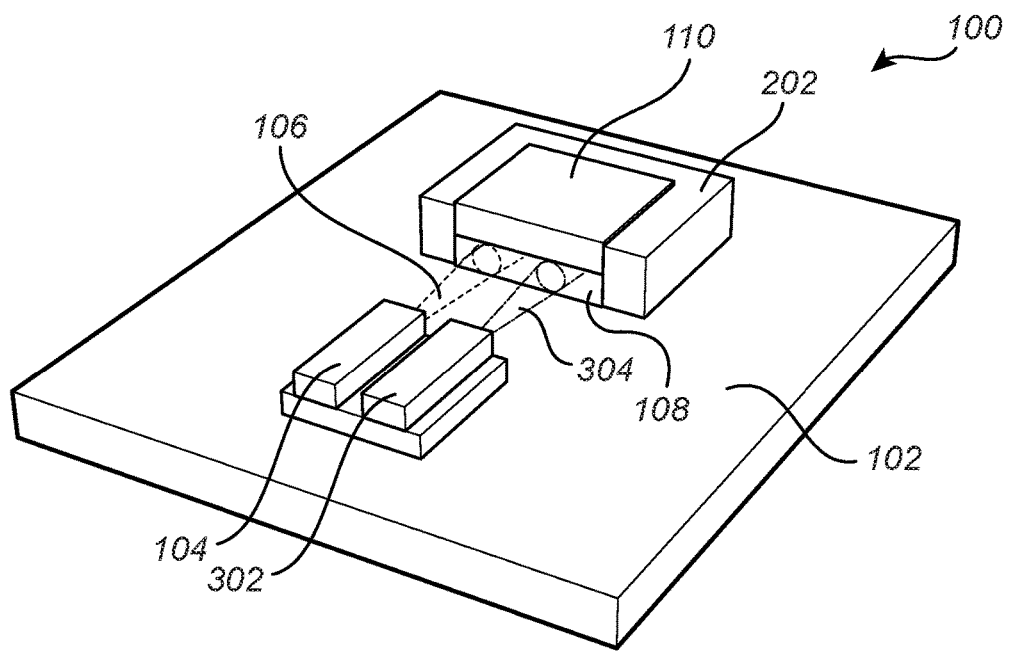

According to some embodiments of the invention, the light emitting device further comprises an additional laser diode. This is shown in FIG. 3. The additional laser diode 302 is configured to emit light 304 of a fourth color, e.g. red, into the translucent light mixing element 108. An advantage of this embodiment is that tuning of the spectral content can be implemented by mixing longer wavelength (red) light from the additional laser diode 302 in the translucent light mixing element. The red light will according to embodiments not be converted in the color converting element. The color converting element 110 may thus be arranged to mix light of the first, second and fourth colors to generate light of a fifth color, and to emit light of the fifth color. Some of the first, second and/or fourth colors may also be emitted. The tuning may be controlled by a controller for individually controlling the light emitting power of the laser diode 104 and the additional laser diode 302 for controlling the fifth color emitted from the color converting element 110. By placing the additional laser diode 302 adjacent to the laser diode 104, the size of the translucent light mixing element 108 and the color converting element 110 need not be affected. Alternately to emitting the light 304 of a fourth color from the additional laser diode 302, the additional laser diode can emit light 304 of the same color as the light 106 emitted by the laser diode 104. In this case, the tuning may be implemented by providing two different color converting elements on top of the light mixing element 108, each of the two different color converting elements may then have different color points, i.e. emit differently colored light.

Figure 10:
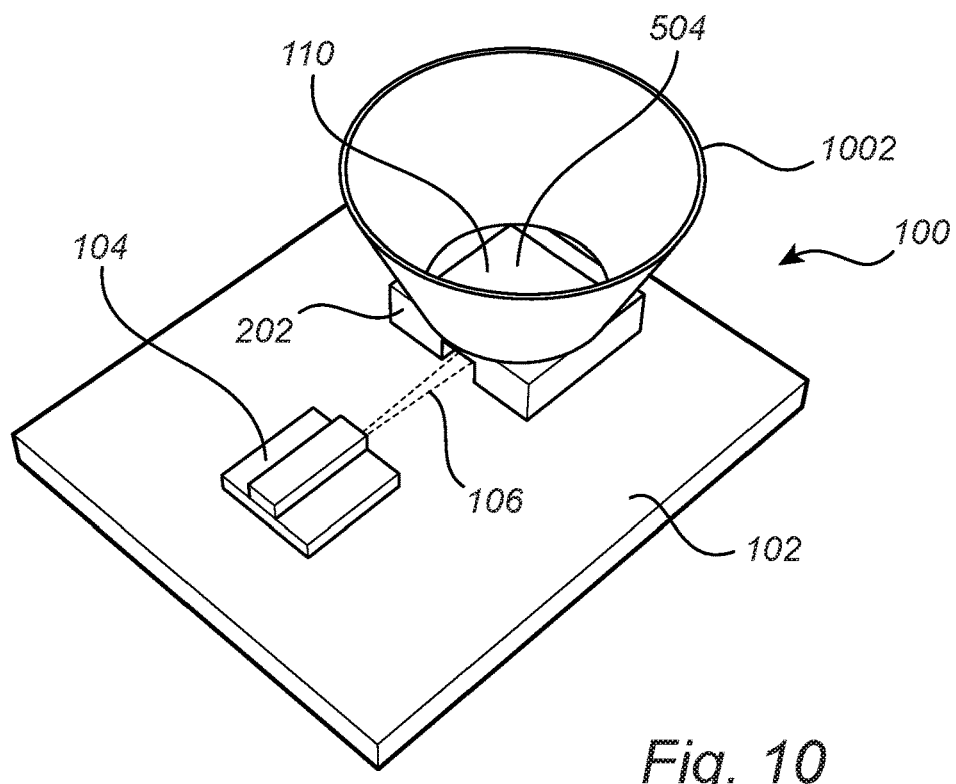

FIG. 10 shows a further embodiment of the present invention in which the light emitting device 100 further comprises a collimator 1002 provided at a light emitting surface 504 of the color converting element 110. Alternatively, the collimator may be replaced by a lens such as a Fresnel lens or a regular spherical lens. The collimator or additional lens can be used for guiding emitted light from the light emitting surface 504 of the color converting element in a desired direction.

Figure 9:
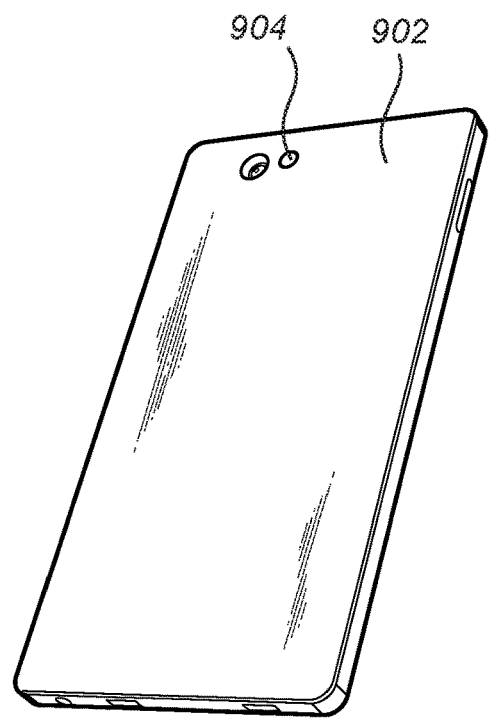
FIG. 9 shows a mobile phone according to embodiments of the invention, FIG. 10 schematically shows a light emitting device according to a sixth embodiment of the invention.

FIG. 9 shows a mobile phone 902 according to embodiments of the invention. In this embodiment, a flash module 904 in the mobile phone 902 comprises the light emitting element 100 as described above.

As can be understood from the above, features described in conjunction with different figures may be combined in one and the same embodiment of the invention. The person skilled in the art thus realizes that the present invention by no means is limited to the embodiments described above. On the contrary, many modifications and variations are possible within the scope of the appended claims. For example, the embodiment shown in FIG. 3 may be combined with the embodiment shown in FIG. 4 such that the additional laser diode 302 in FIG. 3 is configured to emit the light of the fourth color into the translucent light mixing element 108 via the translucent wave guide element 402 in FIG. 4.

Moreover, it should be noted that the feature of having a laser diode 104 arranged on the substrate 102 and being configured to emit light 106 of a first color into the translucent light mixing element 108 should be understood to also cover the possibility of having a plurality of laser diodes emitting light of the first color, wherein said light of the first color emitted by the plurality of laser diodes are mixed before entering the translucent light mixing element 108. Using such a plurality of laser diodes may be advantageously since the power input is increased compared to just using a single laser diode. For even further increasing the power input, it is possible to provide such a single laser diode 104, or a plurality of laser diodes as described above, on more than one side of the translucent light mixing element 108, such as on two, three or four sides of the translucent light mixing element 108. Consequently, light of the first color is coupled into the translucent light mixing element 108 via two, three or four sides of the translucent light mixing element 108.

Furthermore, it should be noted that according to some embodiments of the invention, at least the bottom surface, and according to some embodiments the walls of the translucent light mixing element 108 can be structured in a way that the light entering the translucent light mixing element 108 from the laser diodes 104, 302 is preferably directed towards the light converting element 110, e.g. by means of small prismatic structures perpendicular to the incident beam that reflect the light upwards.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A light emitting device comprising:
a substrate on a heat sink;
a translucent light mixing element arranged on the substrate;
a color converting element arranged on top of the translucent light mixing element and arranged such that light from the translucent light mixing element is coupled into the color converting element; and
a laser diode configured to emit light of a first color into the translucent light mixing element;
wherein the color converting element is configured to convert a part of the light of the first color to a second color, to mix light of the first color with light of the second color to generate light of a third color, and to emit light of the third color; and
wherein the translucent light mixing element has a thermal conductivity exceeding 10W/mK, such that the color converting element can withstand a power density of 2 W/mm$^2$ or more without temperature quenching.

2. The light emitting device of claim 1, wherein the translucent light mixing element is made from at least one of sapphire, aluminum oxynitride, yttrium oxide, yttrium aluminum garnet, and magnesium fluoride.

3. The light emitting device of claim 1, wherein the color converting element is adapted to withstand a power density of 4 W/mm$^2$ or more.

4. The light emitting device of claim 1, wherein the substrate is a common substrate onto which both of the laser diode and the color converting element are arranged.

5. The light emitting device of claim 1, wherein the laser diode is arranged in close proximity to the color converting element.

6. The light emitting device of claim 1, wherein at least one of the color converting element and the translucent light mixing element comprises reflective coatings.

7. The light emitting device of claim 1, wherein the laser diode is configured to emit the light of the first color into a sub portion of a side of the translucent light mixing element, and wherein the translucent light mixing element is provided with reflective coatings fully covering the side except for the sub portion.

8. The light emitting device of claim 1, wherein the laser diode is configured to emit the light of the first color along a surface of the substrate into the translucent light mixing element, and wherein the color converting element is arranged to emit light in a direction substantially perpendicular to the surface of the substrate.

9. The light emitting device of claim 1, further comprising a translucent wave guide element arranged between the laser diode and the translucent light mixing element, wherein the laser diode is configured to emit the light of the first color into the translucent light mixing element via the translucent wave guide element.

10. The light emitting device of claim 1, further comprising a lens arranged between the laser diode and the translucent light mixing element.

11. The light emitting device of claim 1, further comprising an additional laser diode configured to emit light of a fourth color into the translucent light mixing element, wherein the color converting element is arranged to mix light of the first, second and fourth colors to generate light of a fifth color, and to emit light of the fifth color.

12. The light emitting device of claim 1, further comprising at least a portion of a flash module.

13. The light emitting device of claim 11, further comprising a translucent wave guide element arranged between the laser diode and the additional laser diode on one side and the translucent light mixing element on another side, wherein the laser diode and the additional laser diode are configured to emit the light of the first color and the light of the fourth color into the translucent light mixing element via the translucent wave guide element.

14. The light emitting device of claim 11, wherein the additional laser diode is arranged adjacent to the laser diode.

15. The light emitting device of claim 11, further comprising a controller for individually controlling the light emitting power of the laser diode and the additional laser diode for controlling the fifth color emitted from the color converting element.

16. The light emitting device of claim 1, wherein the power of the laser diode is 2Watt or more, and the color converting element has an area of 0.1 mm$^2$ or less.

17. The light emitting device of claim 16, wherein the color converting element has a thickness of 50 µm.

18. A method for manufacturing a light emitting device, the method comprising:
providing a substrate on a heat sink;
arranging a translucent light mixing element on the substrate;

providing a color converting element arranged on top of the translucent light mixing element and arranged such that light from the translucent light mixing element is coupled into the color converting element; and configuring a laser diode to emit light of a first color into the translucent light mixing element;

wherein the color converting element is configured to convert a part of the light of the first color to a second color, to mix light of the first color with light of the second color to generate light of a third color, and to emit light of the third color; and wherein the translucent light mixing element has a thermal conductivity exceeding 10 W/mK, such that the color converting element can withstand a power density of 2 W/mm$^2$ or more without temperature quenching.

19. The method of claim 18, wherein the power of the laser diode is 2 Watt or more, and the color converting element has an area of 0.1 mm$^2$ or less.

20. The method of claim 19, wherein the color converting element has a thickness of 50 μm.

* * * * *